(12) United States Patent
Hung et al.

(10) Patent No.: US 6,696,350 B2
(45) Date of Patent: Feb. 24, 2004

(54) METHOD OF FABRICATING MEMORY DEVICE

(75) Inventors: Chih-Wei Hung, Hsin-chu (TW); Da Sung, Hsinchu (TW); Chien-Chih Du, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/064,140

(22) Filed: Jun. 13, 2002

(65) Prior Publication Data

US 2003/0232484 A1 Dec. 18, 2003

(51) Int. Cl.[7] .............................................. H01L 21/76
(52) U.S. Cl. ....................... 438/433; 438/435; 438/407; 438/420; 438/447
(58) Field of Search ................................ 438/433, 400, 438/407, 418, 419, 420, 424, 425, 435, 436, 437, 438, 445, 447

(56) References Cited

U.S. PATENT DOCUMENTS

| | | | | |
|---|---|---|---|---|
| 4,804,438 A | * | 2/1989 | Rhodes ........................ 156/653 |
| 5,496,754 A | * | 3/1996 | Bergemont et al. ............ 437/43 |
| 5,550,072 A | * | 8/1996 | Cacharelis et al. ............ 437/43 |
| 5,891,770 A | * | 4/1999 | Lee .............................. 438/221 |
| 5,910,016 A | * | 6/1999 | Kazerounian et al. ....... 438/258 |
| 6,172,395 B1 | * | 1/2001 | Chen et al. .................. 257/315 |
| 6,177,315 B1 | * | 1/2001 | Bergemont et al. ......... 438/258 |
| 6,190,979 B1 | * | 2/2001 | Radens et al. .............. 438/301 |
| 6,214,668 B1 | | 4/2001 | Hsu et al. .................... 438/257 |
| 6,534,414 B1 | * | 3/2003 | Wang et al. ................. 438/700 |
| 2001/0017800 A1 | * | 8/2001 | Lee .............................. 365/200 |
| 2002/0019113 A1 | * | 2/2002 | Chung ......................... 438/424 |
| 2002/0019114 A1 | * | 2/2002 | Tirvedi ........................ 438/428 |

* cited by examiner

Primary Examiner—Matthew Smith
Assistant Examiner—Renzo N Rocchegiani
(74) Attorney, Agent, or Firm—Jiang Chyun IP Office

(57) ABSTRACT

A method of fabricating a memory device. A plurality of isolation structures and a plurality of stacked gate structures are sequentially formed on a substrate. While defining the stacked gate structures, the isolation structures are over etched to form a plurality of trenches. A material layer is filled into the trenches. A patterned photoresist layer is formed on the substrate, while a part of the substrate predetermined for forming a drain region is exposed. An ion implantation step is performed to implant a dopant into the part of substrate predetermined for forming the drain region, such that a well is formed. As the trenches are filled with the material layer, the dopant cannot penetrate therethrough.

11 Claims, 8 Drawing Sheets

METHOD OF FABRICATING MEMORY DEVICE

BACKGROUND OF THE INVENTION

1. Field of the Invention

The invention relates in general to a method of fabricating semiconductor device, and more particular, to a method of fabricating a memory device.

2. Related Art of the Invention

Memories are semiconductor devices typically used for storing information or data. As the computer processor becomes more and more powerful, the programs and operations executed by the software are more and more massive; therefore, the demand for memory becomes higher and higher. To fabricate memories with large storage capacity and low cost to complement the development of computer processors, fabrication techniques of memory devices have driven semiconductor fabrication techniques towards higher integration.

For example, flash memory devices that allow multiple operations of saving, reading and erasing and have the advantage that the information stored therein will not disappear after power off have been widely applied for personal computers and other electronic equipment.

The typical flash memory device includes a floating gate and control gate made of doped polysilicon. While performing a programming or erasing operation to the flash memory device, an appropriate voltage is applied to the source region, the drain region and the control gate, so that electrons are injected into the polysilicon floating gate, or pulled out from the floating gate.

Generally speaking, the commonly applied mode for electron injection in a flash memory device includes channel hot-electron injection (CHEI) and Fowler-Nordheim (F-N) tunneling. The ways for programming and erasing are varied according to the injection and pulling modes.

In the conventional stacked-gate flash memory fabrication process, a part of gate dielectric (oxide/nitride/oxide) will remain on a sidewall of the floating gate to form a fence during the step for defining the control gate, the gate dielectric layer and the floating gate. Such a residual fence causes particle contamination in the subsequent process. Further, the gate dielectric fence residing on the sidewall of the floating gate may also cause short circuit between the floating gates affecting the device performance. To avoid forming the gate dielectric layer fence on the sidewall of the floating gate, the conventional method includes increasing the etching rate for silicon oxide during the step of etching the gate dielectric layer, so that complete removal of the gate dielectric layer can be achieved. However, increasing the etching rate of silicon oxide results in the exposed field oxide becoming over etched to form a trench therein. Though overetch to the field oxide does not cause problems to normal flash memory devices, for the BiNOR flash memory (as disclosed in U.S. Pat. No. 6,214,668) that requires high implantation energy (about 50 KeV) to dope p-type dopant (Boron ions) into the substrate, so as to form a p-well, the very deep trench in the field oxide (that is, the very shallow field oxide) may cause the dopant to penetrate through to cause current leakage around the drain region. The isolation between the bit lines are very likely ineffective. To resolve such problems, currently, the mask used for performing the p-type ion implantation has been modified from slot type to hole type to expose only the substrate required to be doped (that is, the field oxide is covered). However, in this era where the device integration further increases, and the linewidth is reduced to 0.25 micron, the above method experiences the problems of photo margin, overlay shift and rounding shape, such that certain regions cannot be implanted as required. The device performance is thus affected, and the yield of the device is decreased.

SUMMARY OF INVENTION

The present invention provides a method of fabricating a memory device to avoid dopant penetrating through the field oxide during the ion implantation step that causes leakage current around the drain region of the memory device.

The method of fabricating a memory device provided by the present invention comprises the following steps. A plurality of isolation structures and a plurality of stacked gate structures are sequentially formed on a substrate. While defining the stacked gate structures, the isolation structures are over etched to form a plurality of trenches. A material layer is filled into the trenches. A selective wet etching step is performed to remove the material layer out of the trenches. A patterned photoresist layer is formed on the substrate, where a part of the substrate predetermined for forming a drain region is exposed thereby. An ion implantation step is performed to implant dopant into the exposed part of the substrate, so as to form a well region. As the trenches are filled with the material layer, the dopant will not penetrate therethrough.

When the gate cap layer, the control gate layer, the gate dielectric layer and the floating layer are patterned to form the stacked gate structures, the trenches formed by over etching the isolation structures are filled with the material layer (bottom anti-reflection coating layer). As mentioned above, such an over etching step is performed to avoid forming the residual gate dielectric layer on the floating gate. The material layer filling the trenches avoids the dopant from penetrating through in the following ion implantation step, so that the current leakage around the drain region is avoided. Therefore, the present invention uses a very simple process to avoid penetration of dopant through the isolation structures in the subsequent ion implantation process, so that the leakage current around the drain region caused thereby is prevented.

Thus, the present invention uses a bottom anti-reflection coating layer to fill the trenches in the isolation layer to prevent subsequent ion implantation process from causing leakage current around the drain region. Therefore, the slot type mask can be used for the ion implantation step to expose the entire area predetermined for forming the drain, including the regions of isolation structures without introducing the problems of photo margin, overlay shift and rounding shape. The degraded device performance and reduced yield caused by the above problems are thus avoided. in addition, the material layer can also be selected from photoresist material.

BRIEF DESCRIPTION OF DRAWINGS

These, as well as other features of the present invention, will become more apparent upon reference to the drawings wherein.

DETAILED DESCRIPTION

Figure 1A:
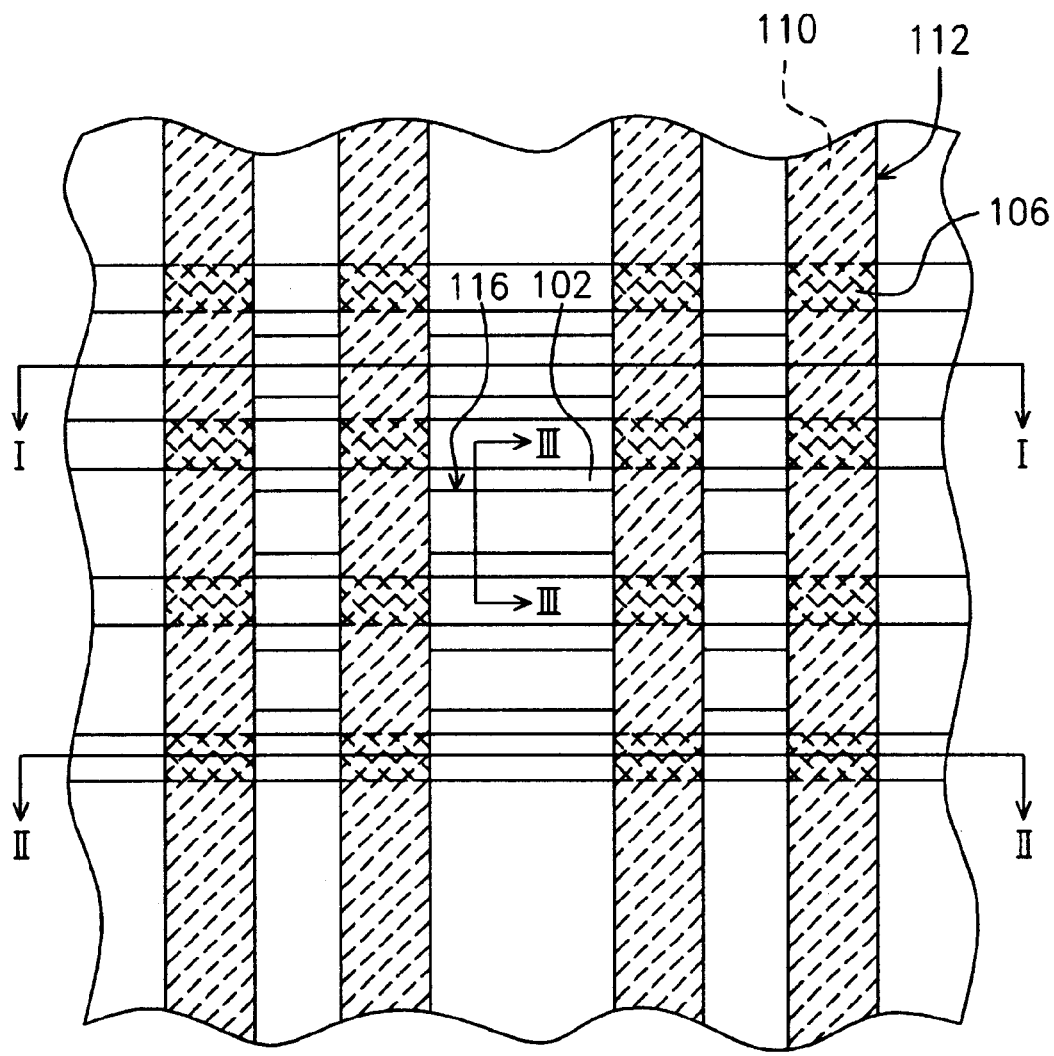
FIGS. 1A to 1D are top views showing the fabrication process of the memory device provided by the present invention.
Figure 1B:
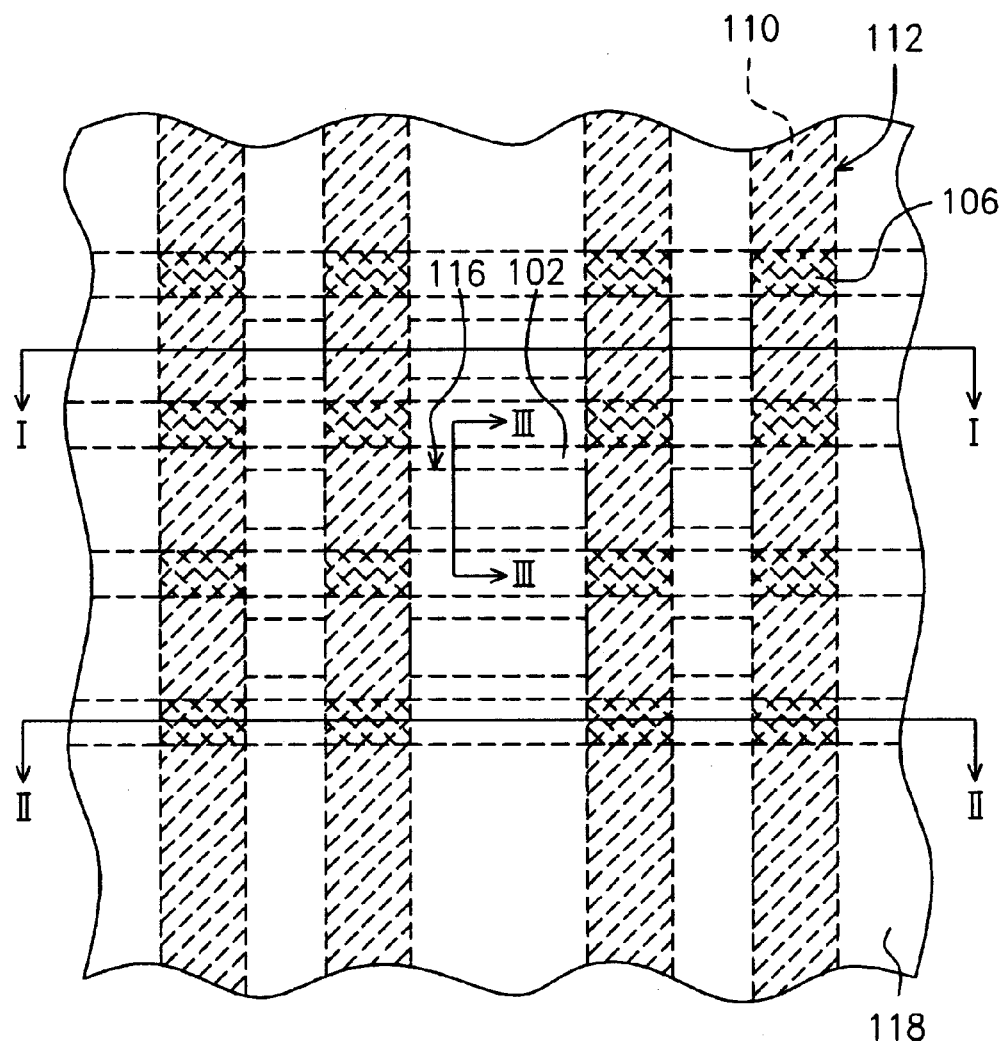
Figure 1C:
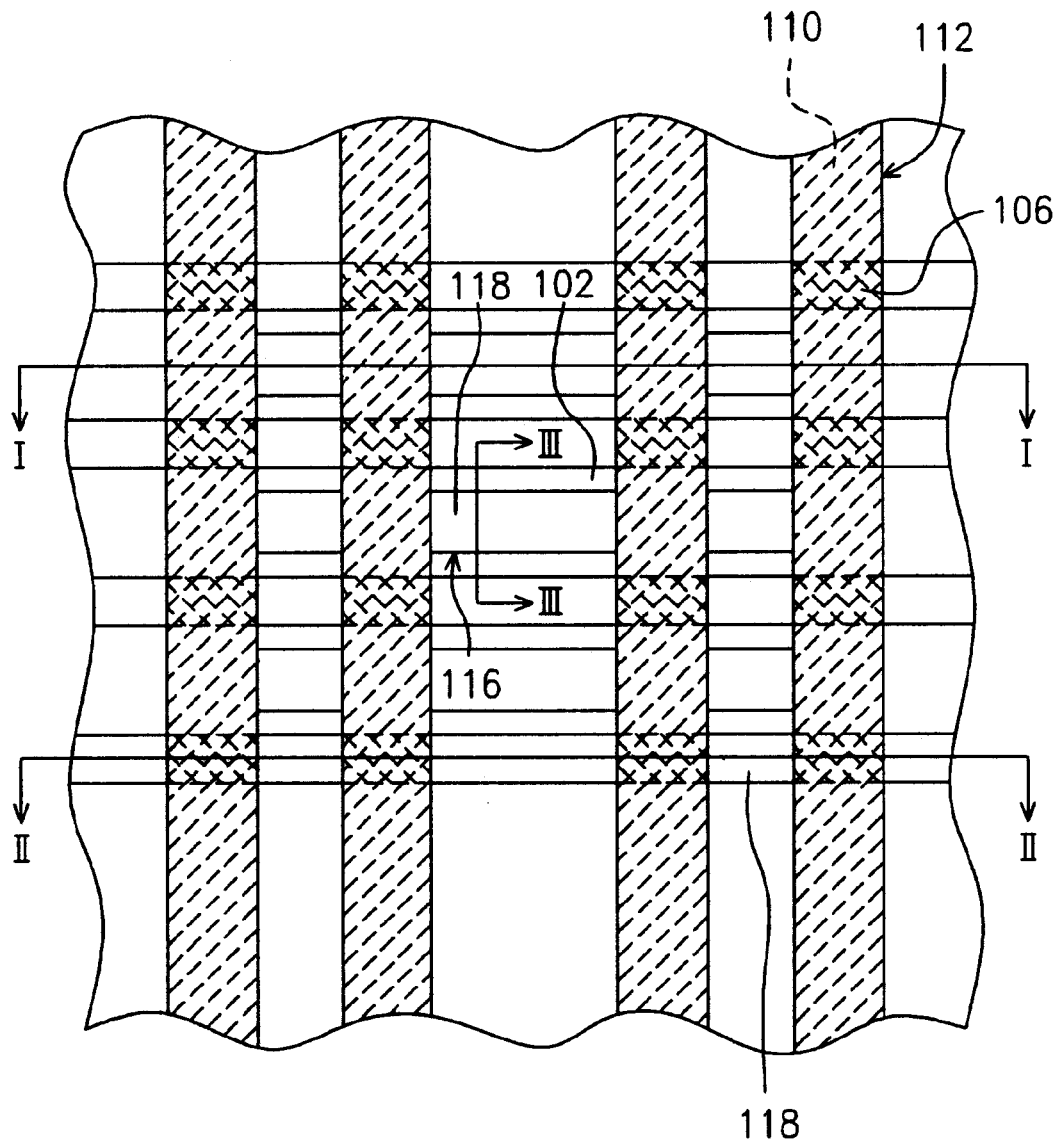
Figure 1D:
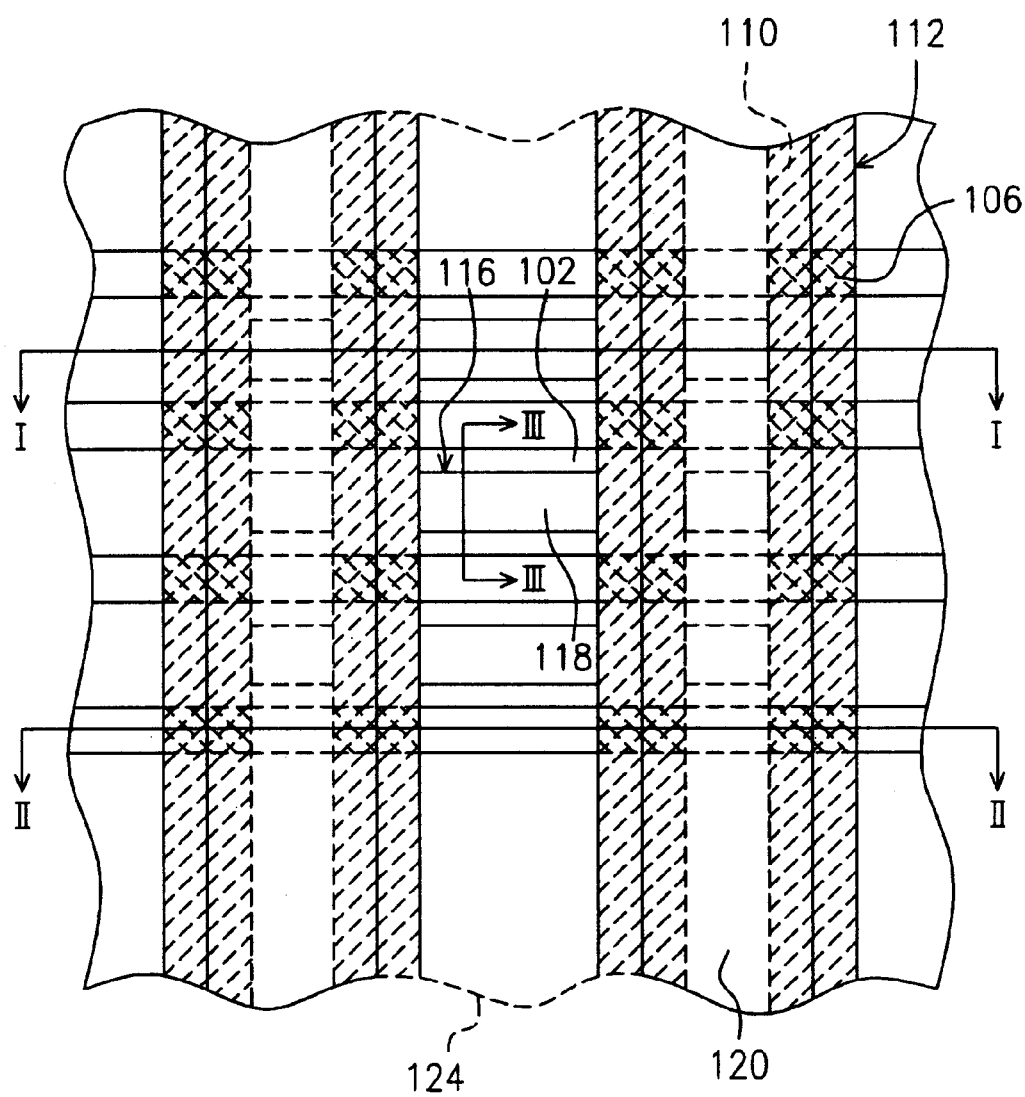
Figure 2A:
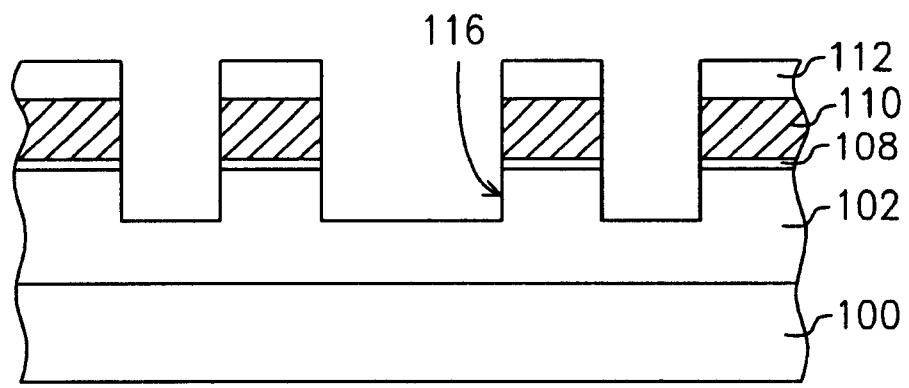
FIGS. 2A to 2D are cross-sectional views cutting along the line I—I in FIGS. 1A to 1D.
Figure 3A:
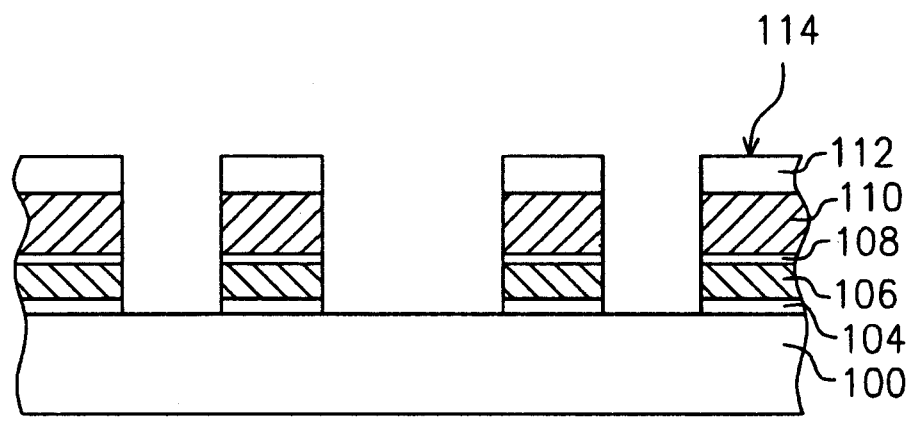
FIGS. 3A to 3D are cross-sectional views cutting along the line II—II in FIGS. 1A to 1D.
Figure 4A:
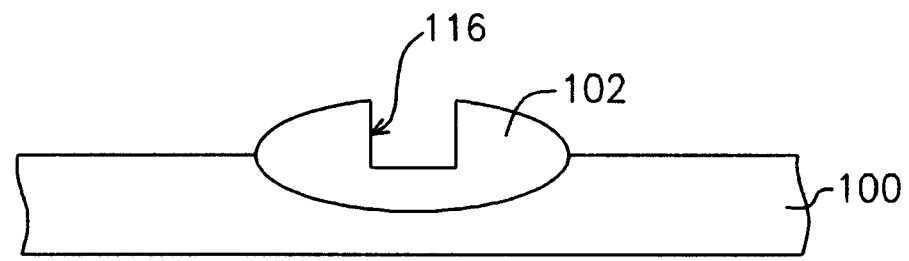
FIGS. 4A to 4D are cross-sectional views cutting along the line III—III in FIGS. 1A to 1D.
Figure 2B:
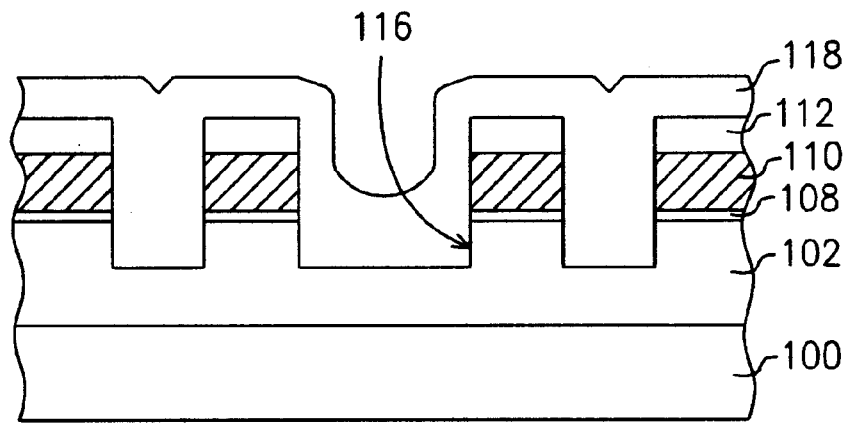
Figure 3B:
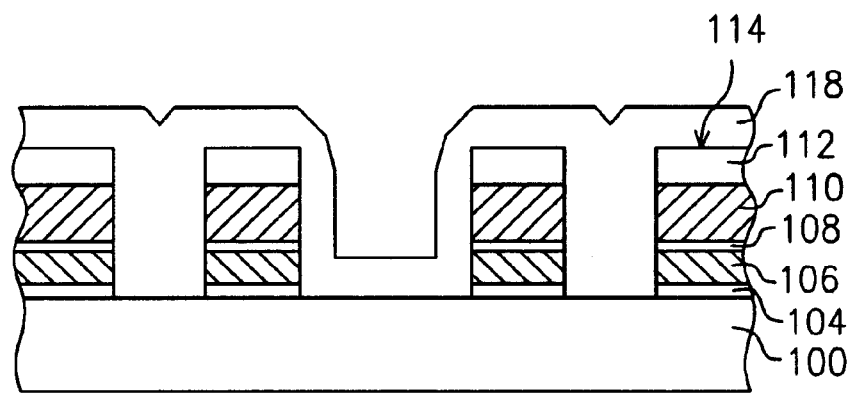
Figure 4B:
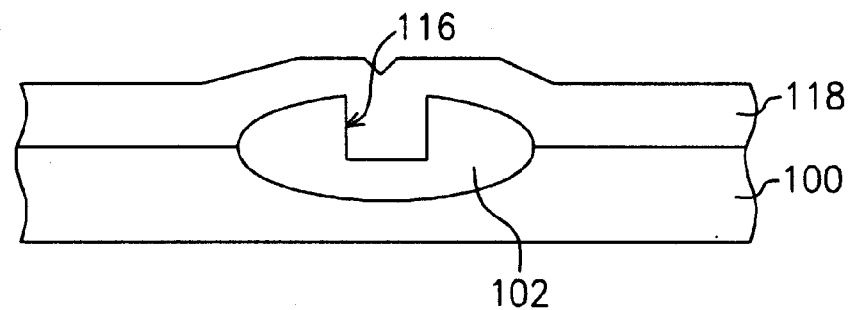
Figure 2C:
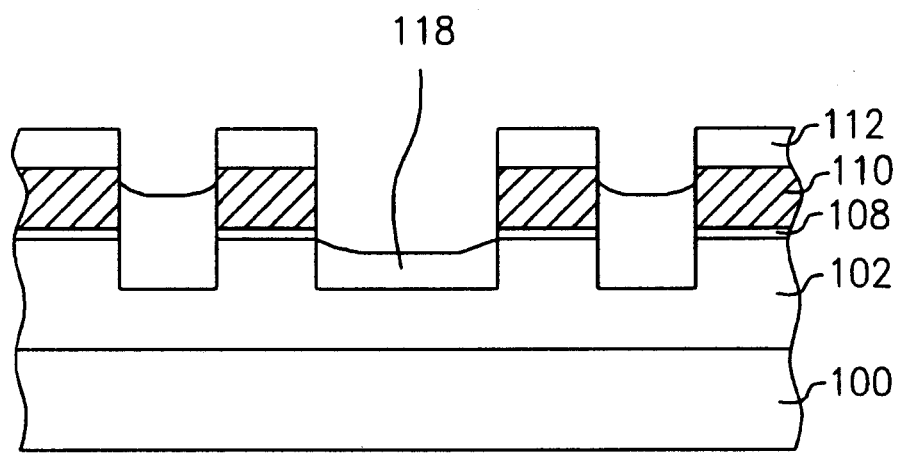
Figure 3C:
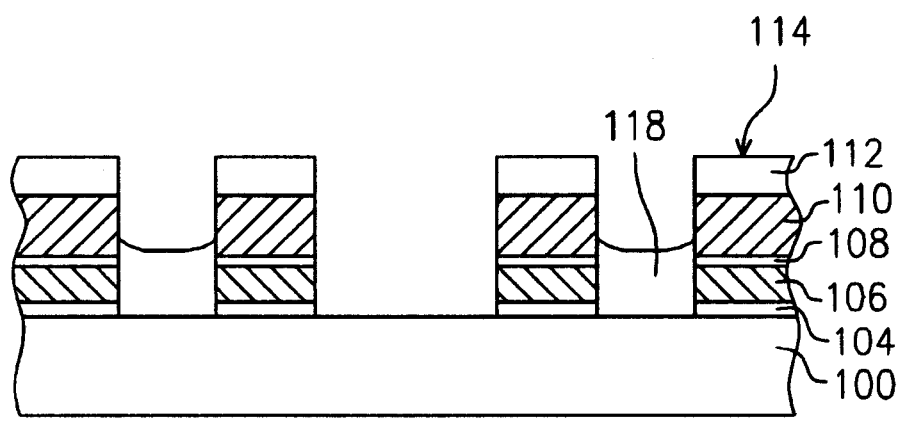
Figure 4C:
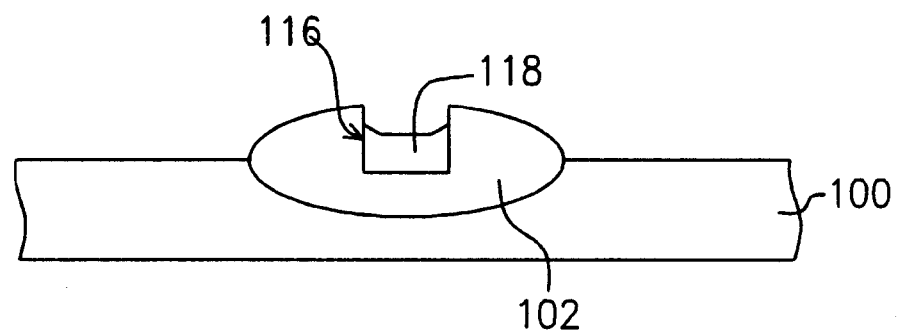
Figure 2D:
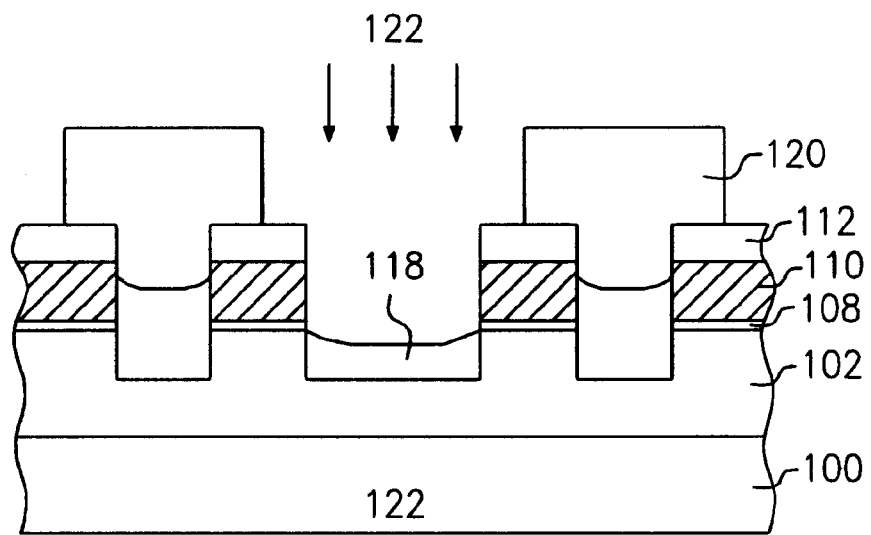
Figure 3D:
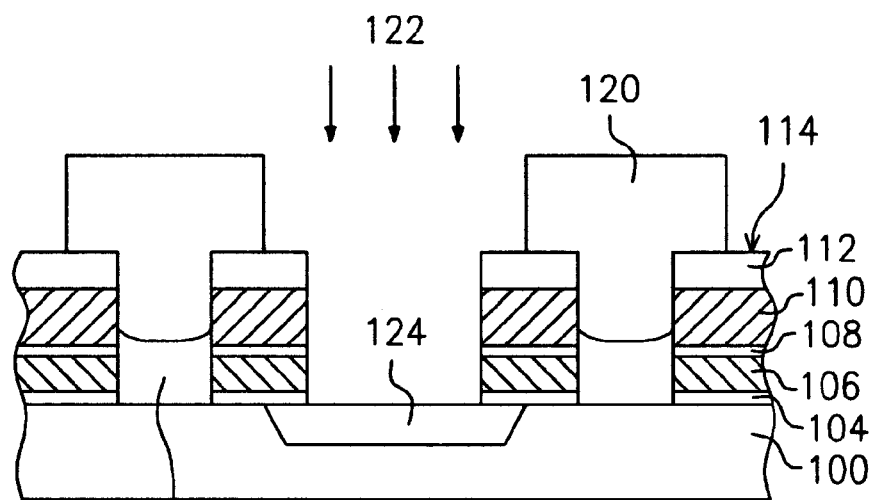
Figure 4D:
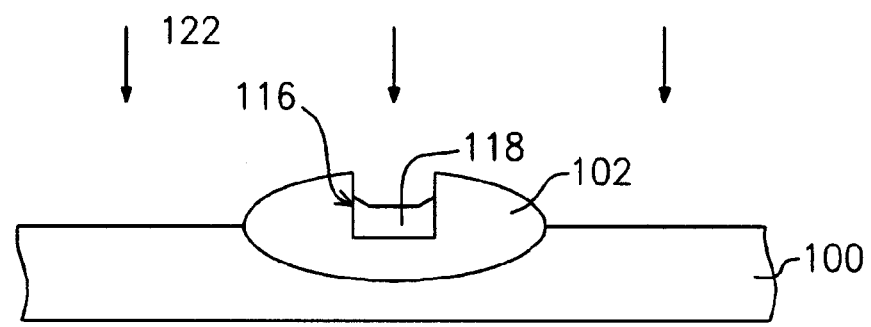

FIGS. 1A to 1D are top views of a memory device according to one embodiment of the present invention. In this embodiment, a BiNOR flash memory is used as an example. FIGS. 2A to 2D, 3A to 3D and 4A to 4D show the cross-sectional views of the memory device as shown in FIGS. 1A to 1D along the cutting lines I—I, II—II and III—III, respectively.

Referring to FIGS. 1A to 4A, a substrate 100, for example a semiconductor silicon substrate, is provided. Isolation structures 102, a tunneling oxide layer 104, a floating gate 106, a gate dielectric layer 108, a control gate 110, and a gate cap layer 112 are formed on the substrate 100. The tunneling oxide layer 104, the floating gate 106, the gate dielectric layer 108, the control gate 110 and the gate cap layer 112 together form the stacked gate structure 114.

The isolation structures 102, for example, field oxide layers or shallow trench isolation structures, are formed to define an active region. In this embodiment, the isolation structures 102 are formed in strips.

The material of the tunneling oxide layer 104 includes silicon oxide, for example. The method for forming the tunneling oxide layer 104 includes thermal oxidation, while the thickness of the tunneling oxide layer 104 is about 90 to 100 angstroms.

The floating gate 106 includes a layer of undoped polysilicon and a layer of N-type typed doped polysilicon. The method for forming the floating gate 106 includes chemical vapor deposition, for example, and the thickness thereof is about 800 angstroms.

The material of the gate dielectric layer 108 includes oxide/nitride/oxide with a thickness of about 60 angstroms/70 angstroms/60 angstroms, and the method for forming the gate dielectric layer 108 includes low pressure chemical vapor deposition. The gate dielectric layer 108 can also be made of other materials such as oxide/nitride/oxide.

The material of the control gate 110 includes polysilicon doped by in-situ ion implantation. The method for forming the control gate 110 includes chemical vapor deposition, while the thickness thereof is about 2000 angstroms.

The material of the gate cap layer 112 includes silicon nitride with a thickness of about 1500 angstrom, and the fabrication method thereof includes chemical vapor deposition, for example.

Referring to FIGS. 1C to 4C, an etch back step is performed to remove the bottom anti-reflection coating layer 118 at a portion out of the trenches 116, while the remaining bottom anti-reflection coating layer 118 completely fills the trenches 116. The method for removing the bottom anti-reflection coating layer 118 includes wet etching, for example, dipping the whole substrate 100 in a diluted sulfuric acid/hydrogenperoxide solution, where the ratio of sulfuric acid to hydrogenperoxide is 5:1. While removing a portion of the bottom anti-reflection coating layer 118 out of the trenches 116, a portion of the bottom anti-reflection coating layer is residual between the stacked-gate structures 114 due to the topography reason. The diluted sulfuric acid/hydrogenperoxide solution has an extreme low etching rate of silicon, silicon nitride and silicon oxide, so that the stacked-gate structures and the substrate will not be damaged thereby.

Referring to FIGS. 1D to 4D, a patterned photoresist layer 120 is formed over the substrate 100. Such patterned photoresist layer 120 exposes the region predetermined for forming the drain region. An ion implantation step 122 is performed with the stacked-gate structure 114 and the patterned photoresist layer 120 as a mask. A p well 124 is thus formed in the substrate 100 at one side of the stacked-gate structure 114. The dopant implanted by the ion implantation step includes boron ions, the implantation energy is about 50 KeV, and the dopant concentration is about $1 \times 10^{13}$ atoms/$cm^{-2}$. The BARC layer 118 between the patterned photoresist layer 120 and the stacked-gate structure 114 is then removed, followed by a thermal oxidation step. The thermal oxidation step is performed at about 850° C. in an oxygen-containing environment for drive-in of the dopant. Because BARC layer 118 is formed filling the trenches 116, the dopant cannot penetrate through the isolation structures 106 to cause the leakage current of the drain region. The subsequent process of the flash memory is known as prior art, so that description is not further introduced.

As mentioned in the embodiment, the etching rate for silicon oxide is increased during the step of forming the stacked-gate structures 114, so as to prevent gate dielectric layer 108 from remaining on sidewall of the floating gate 106. Thereby, the isolation structures 102 are over etched and form trenches 116 therein. By filling the trenches 116 with the bottom anti-reflection layer 118, the dopant cannot penetrate through the isolation structures 102 during the subsequent ion implantation process; and therefore, the leakage current around the drain region is prevented from occurring. Next, after the ion implantation process, the bottom anti-reflection coating layer 118 can be simultaneously removed with the patterned photoresist layer 120.

The present invention uses the bottom anti-reflection coating layer to fill the trenches of the isolation structures, so as to prevent the dopant from penetrating through the isolation structures in the subsequent ion implantation process. Therefore, the formation of well region can be performed with a slot type mask which exposes the entire area (including the isolation structures) predetermined to be doped. The problems of photo margin, overlay shift and rounded shape induced by hole shape mask that cause certain areas to be unable to be doped, device failure and yield decrease are eliminated.

As mentioned in the embodiment, the etching rate for silicon oxide is increased during the step of patterning the gate cap layer 112, the control gate 110, the gate dielectric layer 108 and the floating gate 106 for forming the stacked-gate structures 114 to prevent gate dielectric layer 108 residual on sidewall of the floating gate 106. Thereby, the isolation structures 102 are over etched to form trenches 116 therein. By filling the trenches 116 with the bottom anti-reflection layer 118, the dopant cannot penetrate through the isolation structures 102 during the subsequent ion implantation process; and therefore, the leakage current around the drain region is prevented from occurring. Further, while removing the patterned photoresist layer 120, the bottom anti-reflection coating layer 118 residual between the stacked-gate structures 114 can be consequently removed. Therefore, the substrate silicon 100 can be implanted with the dopant as required without the obstruction of the residual bottom anti-reflection coating layer 118.

The present invention uses the bottom anti-reflection coating layer to fill the trenches of the isolation structures, so as to prevent the dopant from penetrating through the isolation structures in the subsequent ion implantation process. Therefore, the formation of well region can be performed with a slot type mask which exposes the entire area (including the isolation structures) predetermined to be doped. The problems of photo margin, overlay shift and rounded shape induced by hole shape mask that cause certain areas to be unable to be doped, device failure and yield decrease are eliminated. In addition, the material employed can also be photoresist material.

Other embodiments of the invention will appear to those skilled in the art from consideration of the specification and practice of the invention disclosed herein. It is intended that the specification and examples are to be considered as exemplary only, with a true scope and spirit of the invention being indicated by the following claims.

What is claimed is:

1. A method of fabricating memory device, comprising:
   providing a substrate on which a plurality of isolation structures and a plurality of stacked-gate structures are formed, wherein a plurality of trenches are formed in the isolation structures due to over etching during a step for forming the stacked-gate structures;
   filling the trenches with a bottom anti-reflection coating layer;
   forming a patterned photoresist layer over the substrate, wherein a part of the substrate predetermined to be implanted is exposed; and
   performing an ion implantation step to implant dopant into the exposed part of the substrate for forming a well region, wherein the dopant does not penetrate through the isolation structures.

2. The method according to claim 1, wherein the step of filling the trenches with the bottom anti-reflection coating layer includes spin-on coating.

3. The method according to claim 1, wherein the bottom anti-reflection coating layer is formed with a thickness of about 1500 angstroms.

4. The method according to claim 1, wherein the step of filling the trenches further comprises:
   forming the bottom anti-reflection coating layer over the substrate to fill the trenches and spaces between the stacked-gate structures; and
   removing the bottom anti-reflection coating layer at a portion out of the trenches.

5. The method according to claim 4, wherein the step of removing the bottom anti-reflection coating layer includes wet etching.

6. The method according to claim 5, wherein the wet etching step includes using a dilute sulfuric acid/hydrogenperoxide solution as an etchant.

7. A method of fabricating a memory device, comprising:
   providing a substrate comprising at least a plurality of isolation structures thereon, wherein the isolation structures are over etched to form a plurality of trenches therein;
   forming a bottom anti-reflection coating layer over the substrate; and
   removing the bottom anti-reflection coating layer at a portion out of the trenches, while the remaining bottom anti-reflection coating layer fills the trenches to prevent dopant implanted in an ion implantation step from penetrating through the isolation structures.

8. The method according to claim 7, wherein the step of forming the bottom anti-reflection coating layer includes spin-on coating.

9. The method according to claim 7, wherein the step of forming the bottom anti-reflection coating layer includes forming the bottom anti-reflection coating layer with a thickness of about 1500 angstroms.

10. The method according to claim 7, wherein the step of removing the bottom anti-reflection coating layer further comprises wet etching.

11. The method according to claim 7, wherein the step of removing the bottom anti-reflection coating layer further comprises using a sulfuric acid/hydroperoxide solution as an etchant.

* * * * *